US011894813B2

(12) United States Patent
Lee

(10) Patent No.: US 11,894,813 B2
(45) **Date of Patent: *Feb. 6, 2024**

(54) CONSTANT LEVEL-SHIFT BUFFER AMPLIFIER CIRCUITS

(71) Applicant: Omni Design Technologies Inc., Milpitas, CA (US)

(72) Inventor: Hae-Seung Lee, Lexington, MA (US)

(73) Assignee: Omni Design Technologies Inc., Milpitas, CA (US)

( * ) Notice: Subject to any disclaimer, the term of this patent is extended or adjusted under 35 U.S.C. 154(b) by 242 days.

This patent is subject to a terminal disclaimer.

(21) Appl. No.: 17/371,340

(22) Filed: Jul. 9, 2021

(65) Prior Publication Data

US 2021/0336590 A1 Oct. 28, 2021

Related U.S. Application Data

(63) Continuation of application No. 16/538,303, filed on Aug. 12, 2019, now Pat. No. 11,114,986.

(51) Int. Cl.

*H03G 3/30* (2006.01)
*H03F 3/00* (2006.01)
*H03G 3/00* (2006.01)
*H03F 3/45* (2006.01)

(52) U.S. Cl.

CPC ......... *H03F 3/005* (2013.01); *H03F 3/45179* (2013.01); *H03G 3/008* (2013.01)

(58) Field of Classification Search

CPC ................ H03F 3/005; H03F 3/45179; H03F 2203/45551; H03F 3/45475; H03F 2203/5012; H03F 2203/5036; H03F 3/505; H03G 3/008; H03G 3/30; H03L 5/00

USPC .......................................... 330/284; 327/333

See application file for complete search history.

(56) References Cited

U.S. PATENT DOCUMENTS

| | | | |
|---|---|---|---|
| 5,300,834 A | 4/1994 | Bret | |
| 5,777,518 A | 7/1998 | Bailey | |
| 6,459,146 B2 | 10/2002 | Kono | |
| 6,459,246 B1 | 10/2002 | Roo | |
| 6,717,451 B1 | 4/2004 | Klein et al. | |
| 7,911,274 B2 * | 3/2011 | Morikawa ............ | H03G 1/0029 330/288 |

(Continued)

OTHER PUBLICATIONS

ISA, "International Search Report", PCT/US20/42747, dated Nov. 18, 2020.

*Primary Examiner* — Khanh V Nguyen

(74) *Attorney, Agent, or Firm* — Intrinsic Law Corp.

(57) ABSTRACT

A push-pull dynamic amplifier is operable in reset and amplification phases. The amplifier includes first NMOS and PMOS input transistors that are electrically coupled to a first input terminal and a first output terminal. Second NMOS and PMOS input transistors are electrically coupled to a second input terminal and a second output terminal. First and second reset switches are electrically coupled to the first and second output terminals, respectively. A power supply switch is electrically coupled to the first and the second PMOS transistors, and a ground switch is electrically coupled to the first and the second NMOS transistors. During the reset phase, the reset switches are closed and the power supply switch and the ground switch are opened. During the amplification phase, the reset switches are opened and the power supply switch and the ground switch are closed.

8 Claims, 18 Drawing Sheets

(56) References Cited

U.S. PATENT DOCUMENTS

| | | | | |
|---|---|---|---|---|
| 8,329,525 | B2 | 12/2012 | Arnaud | |
| 9,178,517 | B2 * | 11/2015 | Agrawal | H03K 19/017 |
| 9,214,912 | B2 | 12/2015 | Lee | |
| 10,134,894 | B2 | 11/2018 | Kumar et al. | |
| 10,249,769 | B1 * | 4/2019 | Daley | H01L 27/0629 |
| 10,707,234 | B2 * | 7/2020 | Choi | H01L 27/1203 |
| 2003/0107432 | A1 | 6/2003 | Huynh | |
| 2008/0169875 | A1 | 7/2008 | Xu | |
| 2008/0258798 | A1 * | 10/2008 | Huang | H03F 3/505 327/333 |
| 2009/0146723 | A1 * | 6/2009 | Kimura | H03F 3/505 327/333 |
| 2020/0010315 | A1 * | 1/2020 | Tingleff | B81B 3/0021 |
| 2020/0321860 | A1 * | 10/2020 | Amin | H02M 3/073 |

* cited by examiner

CONSTANT LEVEL-SHIFT BUFFER AMPLIFIER CIRCUITS

RELATED APPLICATIONS

This application is a continuation of U.S. patent application Ser. No. 16/538,303, titled "Constant Level-Shift Buffer Amplifier Circuits," filed on Aug. 12, 2019, which is hereby incorporated by reference.

TECHNICAL FIELD

This application generally relates to buffer amplifier circuits.

BACKGROUND

Buffer amplifiers are widely used in electronic systems. They provide high input impedance, low output impedance, and voltage gain close to 1. For example, level-shifting buffer amplifiers (LSBAs) are employed in switched-capacitor circuits to bootstrap the virtual ground node, thereby improving the circuit performance. See, for example, U.S. Pat. No. 9,214,912, which is hereby incorporated by reference.

FIG. 1 shows a prior art buffer amplifier circuit 10 comprising a source follower. The gate of the NMOS transistor M1 is the input terminal of the buffer amplifier and the source of M1 is the output terminal. The current source I provides the bias current for M1, and the current $l_o$ is the load current, the current delivered to the load. The current source I is typically implemented by a transistor current source, for example, an NMOS transistor. The gate-to-source voltage of M1 provides the level shift $V_{LS}$ between the input and the output voltages:

$$V_{LS} = V_{GS1} = V_T + \sqrt{\frac{2I_{D1}}{\mu_n C_{OX}\left(\frac{W}{L}\right)_1}} = V_T + \sqrt{\frac{2(I + I_O)}{\mu_n C_{OX}\left(\frac{W}{L}\right)_1}} \quad (1)$$

where $I_{D1}$ is the drain current through $M_1$, and $$\left(\frac{W}{L}\right)_1$$

is W over L ration of M1. $V_T$ is the threshold voltage, $\mu_n$ the electron mobility, and $C_{OX}$, the oxide capacitance per unit area.

The incremental gain of the buffer amplifier is given by $$a_v = \frac{1}{1 + \frac{1}{g_{m1}}\left(\frac{1}{r_{o1}} + \frac{1}{R_{out}}\right)} \quad (2)$$

where $g_{m1}$ and $r_{o1}$ are the transconductance and the output resistance of M1, respectively, and $R_{out}$ is the incremental output resistance of the current source I. The incremental gain in Equation (2) is typically slightly less than 1, and depends on the device geometry, bias condition, and $R_{out}$.

The output resistance $R_o$ of the source follower buffer amplifier is approximately the inverse of the transconductance of M1:

$$R_o \approx \frac{1}{g_{m1}} \quad (3)$$

The level shift given by Equation (1) varies considerably, due to process, temperature, and supply voltage (PVT) variations of $V_T$, $\mu_n$, $C_{OX}$, and I. The variation of $V_T$ alone can be as much as 250-350 mV across PVT. The variations of $\mu_n$, $C_{OX}$, and I significantly increase the level shift variation. In addition, the load current $I_O$ also affects the level shift as indicated in Equation (1).

The large amount of variation in the level shift in a source-follower buffer amplifier poses a difficult challenge in systems where a precise, constant level shift is required. For example, in virtual ground bootstrapping circuits in U.S. Pat. No. 9,214,912, the level shift determines the reference voltage of the system, thus needs to be kept constant. It is possible to keep the level shift $V_{GS1}$ constant by adjusting the current I as can be seen in Equation (1). However, given the large variation of $V_T$ and variations of $\mu_n$ and $C_{OX}$, the current I needs to be adjusted by a large factor. As an example, if M1 is biased in weak inversion, more than three orders of magnitude current adjustment would be required just to compensate for $V_T$ variation. This amount of current adjustment is highly undesirable, because the important parameters for the buffer amplifier such as the bandwidth and the output resistance will vary accordingly.

FIG. 2 illustrates another prior art LSBA 20, also called a flipped source follower (FSF). As in the source follower in FIG. 1, the level shift is given by $V_{GS1}$:

$$V_{LS} = V_{GS1} = V_T + \sqrt{\frac{2I}{\mu_n C_{OX}\left(\frac{W}{L}\right)_1}} \quad (4)$$

The transistor M2 provides negative feedback to keep the current through M1 constant at I independent of the load current $I_O$. Therefore, the variation of the level shift due to the load current is eliminated. Another advantage of the FSF compared with the standard source follower in FIG. 1 is that the negative feedback provided by M2 reduces the output resistance by a factor of $g_{m2}r_{o1}$, where $g_{m2}$ is the transconductance of M2, and $r_{o1}$ is the output resistance of M1. However, as in the LSBA in FIG. 1, the level shift is subject to the variations of $V_T$, $\mu_n$ and $C_{OX}$, thus is sensitive to PVT variations.

SUMMARY

Example embodiments described herein have innovative features, no single one of which is indispensable or solely responsible for their desirable attributes. The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Without limiting the scope of the claims, some of the advantageous features will now be summarized. Other objects, advantages and novel features of the disclosure will be set forth in the following detailed description of the disclosure when considered in conjunction with the drawings, which are intended to illustrate, not limit, the invention.

One or more embodiments are directed to a level shifting buffer amplifier circuit having an input terminal and an output terminal, a first transistor, a current source, a variable resistance electrically coupled to the first transistor, wherein a resistance of the variable resistance is a function of a voltage at a control terminal, and wherein the buffer amplifier provides a constant level shift between the input and the output terminals.

The variable resistance may comprise a variable resistor in some embodiments. In other embodiments, the variable resistor may comprise a transistor, for example a PMOS transistor or an NMOS transistor. The transistor(s) may further comprise drain, source and gate terminals. In some aspects, said transistor(s) may have a variable resistance between their drain and source terminals. In other aspects, said transistor(s) may have a gate terminal acting as said control terminal.

One or more embodiments are directed to a level shifting buffer amplifier producing a level shift between an input and output terminals having a first transistor and a second transistor, a current source, and a variable resistance electrically coupled to the first transistor, wherein a resistance of the variable resistance is a first function of a voltage at a control terminal, wherein the level shift is a second function of the voltage at the control terminal.

BRIEF DESCRIPTION OF THE DRAWINGS

For a fuller understanding of the nature and advantages of the present concepts, reference is made to the following detailed description of preferred embodiments and in connection with the accompanying drawings. In the drawings, like reference characters generally refer to like features (e.g., functionally-similar and/or structurally-similar elements).

DETAILED DESCRIPTION

The following discussion illustrates detailed descriptions of various concepts related to, and embodiments of, inventive apparatus relating to constant level-shift buffer amplifier circuits. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

As is evident from Equations (1) and (4), prior art source follower buffer amplifiers' level shift varies a great deal across PVT. The inventors have recognized that it is advantageous to provide a control for the level shift to make it constant (or less variable), for example, over PVT variation.

Figure 3:
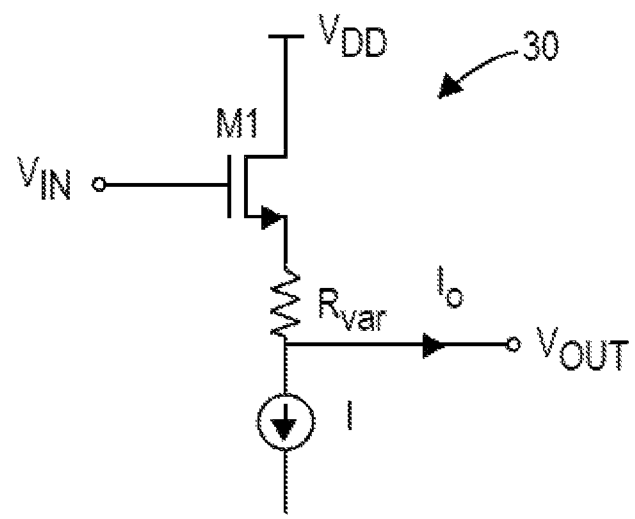
FIG. 3 is a schematic diagram of a level shifting buffer amplifier circuit according to one or more embodiments.

FIG. 3. shows an exemplary buffer amplifier 30 comprising an NMOS input transistor M1, a current source I, and a variable resistor $R_{var}$.

The variable resistor $R_{var}$ provides an IR voltage drop such that the level shift is given by:

$$V_{LS} = V_{GS1} + (I + I_O)R_{var} = V_T + \sqrt{\frac{2(I + I_O)}{\mu_n C_{OX}\left(\frac{W}{L}\right)_1}} + (I + I_O)R_{var} \tag{5}$$

where $V_{GS1}$ is the gate-to-source voltage of M1, $$\left(\frac{W}{L}\right)_1$$

is the width (W) over length (L) ratio of M1.

As can be seen in Equation (5), it will be possible to adjust the value of $R_{var}$ to counter the variations of $V_T$ and $$\sqrt{\frac{2(I + I_O)}{\mu_n C_{OX}\left(\frac{W}{L}\right)_1}}$$

without changing the bias current I.

In some applications, it may be advantageous to adjust both $R_{var}$ and I for more flexibility in the adjustment.

Figure 4:
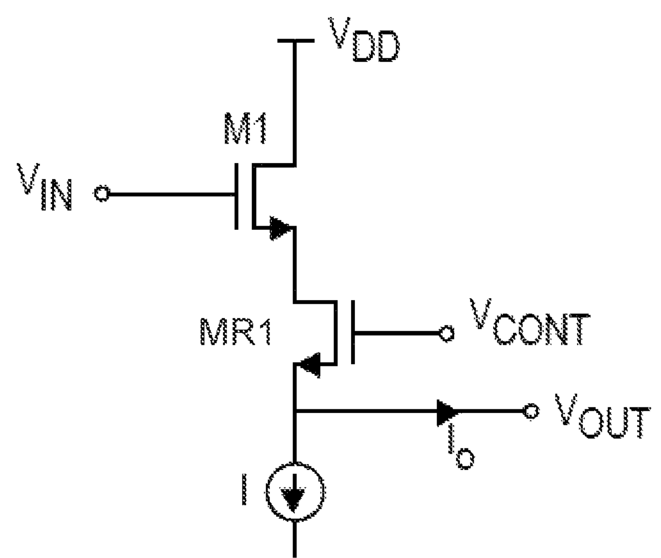
FIG. 4 is a schematic diagram of a level shifting buffer amplifier circuit according to the first embodiment of the invention using an NMOS transistor as a variable resistor.

FIG. 4 illustrates a level shifting buffer amplifier according to one or more embodiments wherein the variable resistor $R_{var}$ of the previous example is substituted by an NMOS transistor MR1. We note that in this and other present embodiments and examples, the substitution or replacement of a transistor in place of a resistor, e.g., a variable resistance, is intended broadly as would be understood by those skilled in the art. Therefore, the description of a resistor or variable resistor to comprise such other components (e.g., NMOS or PMOS transistors) is intended to convey a general ability to insert or replace the resistance or variable resistance of one such element with the other as best suits a given implementation.

The NMOS transistor MR1 is biased in the triode region so that its ON resistance $R_{ON}$ functions as $R_{var}$, which is controlled by the control voltage $V_{CONT}$ applied at the gate of MR1.

$$R_{var} = R_{ON} \approx \frac{1}{\mu_n C_{OX}\left(\frac{W}{L}\right)_{R1}(V_{CONT} - V_S - V_T)} \quad (6)$$

where $$\left(\frac{W}{L}\right)_{R1}$$

is the W over L ratio of MR1, $V_{CONT}$ is the control voltage applied to the gate of MR1, and $V_S$ the voltage at the source of MR1, which is the output voltage $V_O$.

Figure 1:
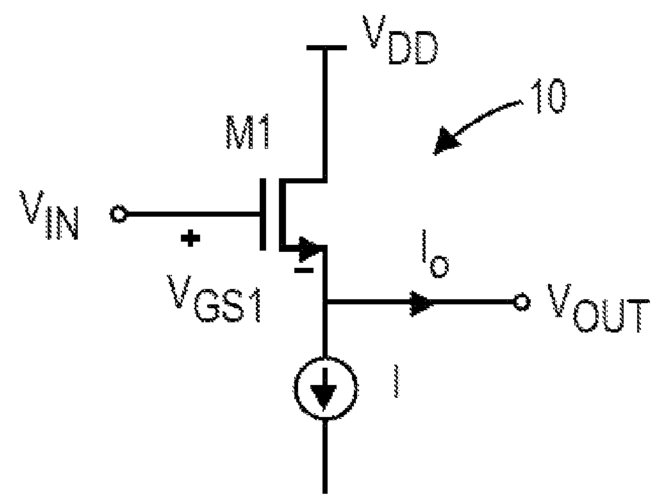
FIG. 1 is a schematic diagram of a source follower buffer amplifier circuit according to the prior art.

The variable-resistance embodiments of FIGS. 3 and 4 can result in higher output resistances and lower voltage gains than the prior art LSBA of FIG. 1. The variable resistor $R_{var}$ is in series with the resistance into the source of M1, increasing the output resistance to:

$$R_o \approx \frac{1}{g_{m1}} + R_{var} \quad (7)$$

Since $R_{var}$ is a function of the output voltage according to Equation (6), it can be shown that the incremental gain is further reduced from Equation (2) by the factor of $$1 + \frac{R_{var}I}{V_{GSR1} - V_T}$$

giving:

$$a_v = \frac{1}{1 + \frac{1}{g_{m1}}\left(\frac{1}{r_{o1}} + \frac{1}{R_{out}}\right)} \cdot \frac{1}{1 + \frac{R_{var}I}{V_{GSR1} - V_T}} \quad (8)$$

where $V_{GR1}$ is the gate-to-source voltage of MR1.

Figure 5:
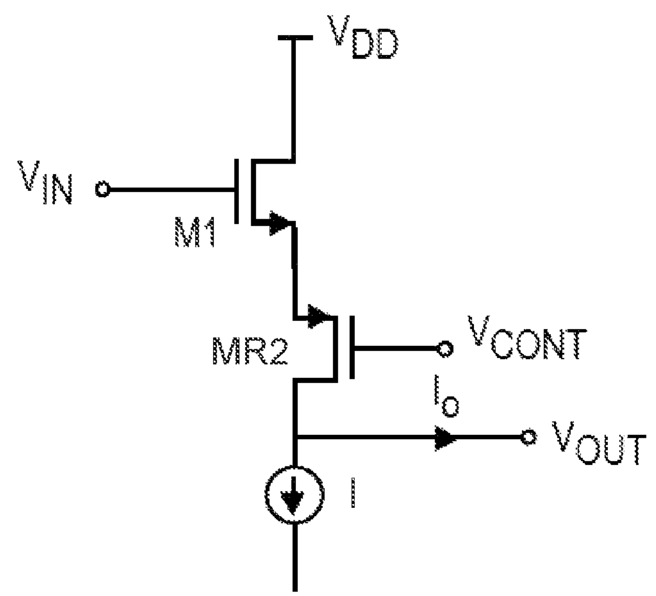
FIG. 5 is a schematic diagram of the first embodiment of a level shifting buffer amplifier circuit according to the first embodiment of the invention using a PMOS transistor as a variable resistor.

FIG. 5 illustrates a level shifting buffer amplifier according to one or more embodiments wherein the former variable resistor $R_{var}$ is substituted by a PMOS transistor MR2. The PMOS transistor MR2 is biased in the triode region so that its ON resistance $R_{ON}$ functions as $R_{var}$, which is controlled by the control voltage $V_{CONT}$:

$$R_{var} = R_{ON} \approx \frac{1}{\mu_n C_{OX}\left(\frac{W}{L}\right)_{R2}|V_{CONT} - V_S - V_T|} \quad (9)$$

where $$\left(\frac{W}{L}\right)_{R2}$$

is the W over L ratio of MR2, $V_{CONT}$ is the control voltage applied to the gate of MR2, and $V_S$ the voltage at the source of MR2.

The output resistance of the embodiment of the present invention in FIG. 3 with the variable resistance in FIG. 5 is given by:

$$R_o \approx \frac{1}{g_{m1}} + R_{var} \quad (10)$$

The incremental gain in this case, however, is increased by a factor of $$1 + \frac{R_{var}I}{|V_{GSR2} - V_T|}:$$

$$a_v = \frac{1 + \frac{R_{var}I}{|V_{GSR2} - V_T|}}{1 + \frac{1}{g_{m1}}\left(\frac{1}{r_{o1}} + \frac{1}{R_{out}}\right)} \quad (11)$$

where $V_{GSR2}$ is the gate-to-source voltage of MR2.

Since this gain is closer to 1 than the LSBA circuit using the variable resistor in FIG. 4, the embodiment of the variable resistor in FIG. 5 may be a preferred embodiment for some applications.

Figure 2:
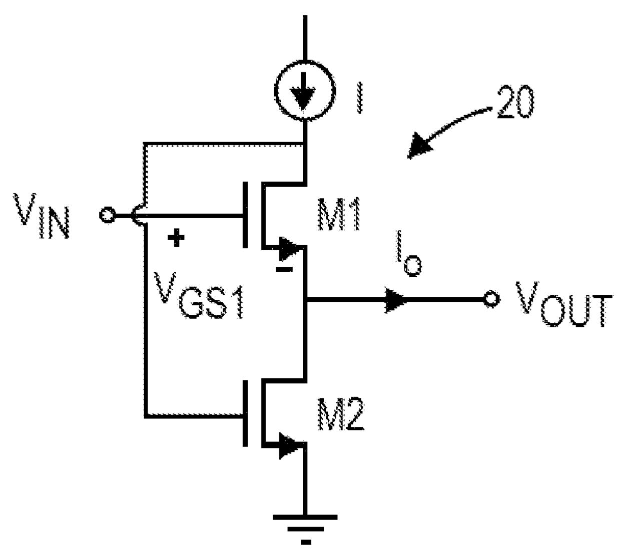
FIG. 2 is a schematic diagram of a flipped source follower buffer amplifier circuit according to the prior art.
Figure 6:
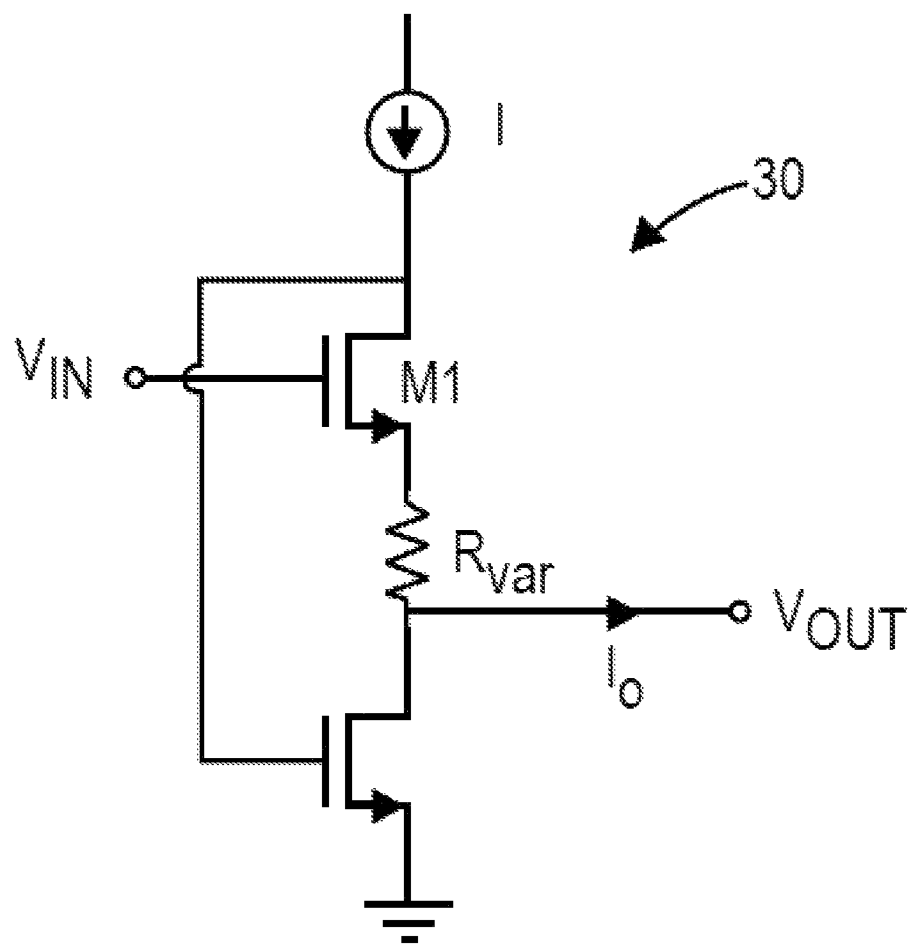
FIG. 6 is a schematic diagram of a level shifting buffer amplifier circuit according to a second embodiment of the invention.

FIG. 6 shows another embodiment of the present invention, based on the FSF in FIG. 2, further including a variable resistor $R_{var}$. The level shift is given by $$V_{LS} = V_{GS1} + IR_{var} = V_T + \sqrt{\frac{2I}{\mu_n C_{OX}\left(\frac{W}{L}\right)_1}} + IR_{var} \quad (12)$$

where $V_{GS1}$ is the gate-to-source voltage of M1, $$\left(\frac{W}{L}\right)_1$$

is the W over L ratio of M1.

Figure 7:
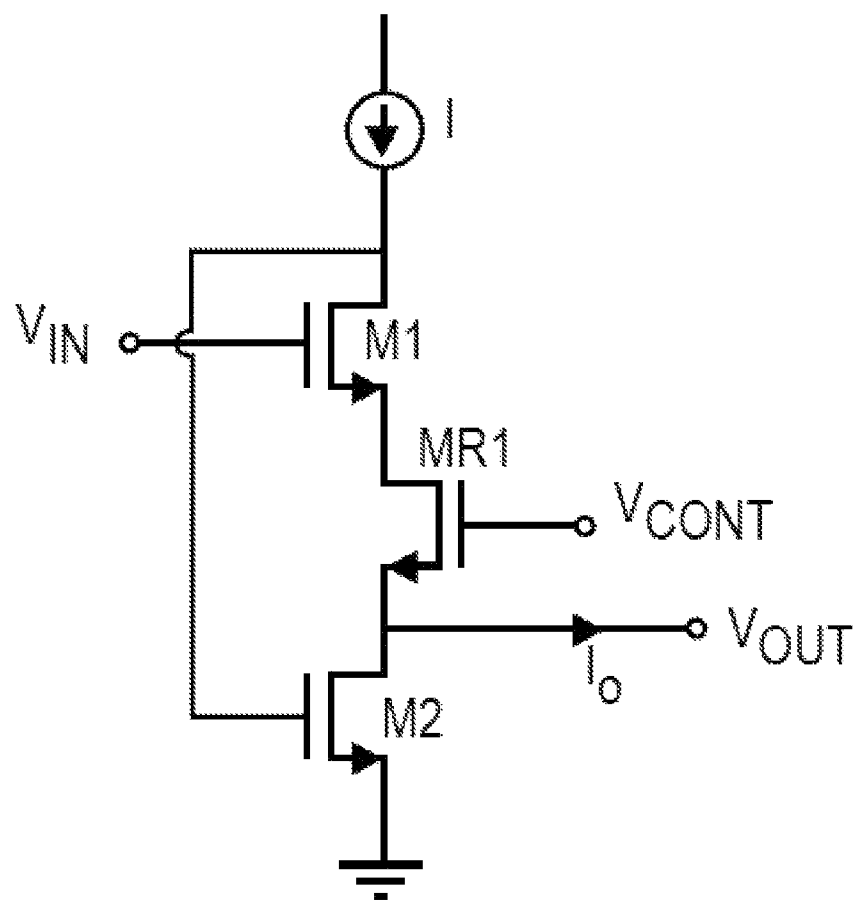
FIG. 7 is a schematic diagram of a level shifting buffer amplifier circuit according to a third embodiment of the invention.
Figure 8:
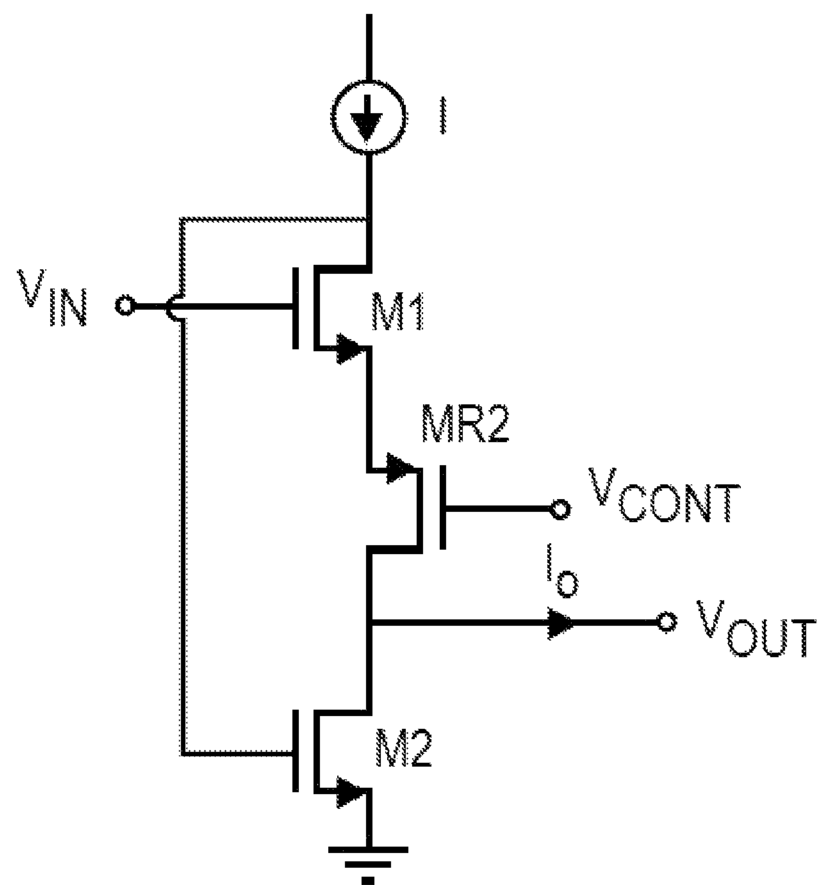
FIG. 8 is a schematic diagram of a level shifting buffer amplifier circuit according to a fourth embodiment of the invention.

Again, the variable resistor $R_{var}$ can be substituted or implemented by an NMOS transistor as in FIG. 7, or by a PMOS transistor as in FIG. 8, where the resistance $R_{var}$ is given by Equation (6) and Equation (9), respectively.

In some aspects, the embodiments in FIGS. 6-8 compared with the embodiments in in FIGS. 3-5 eliminate or reduce the effect of the load current, and the output resistance is also reduced due to the negative feedback provided by M2. The output resistance is given by:

$$R_o \approx \frac{\frac{1}{g_{m1}} + R_{var}}{g_{m2} r_{o1}} \tag{13}$$

where $g_{m1}$ and $g_{m2}$ are the transconductance of M1 and M2, respectively, and $r_{o1}$ is the output resistance of M1. The incremental gains of the LSBA in FIG. 7 is given by $$a_v = \frac{1}{1 + \frac{1}{g_{m1} r_{o1}}} \cdot \frac{1}{1 + \frac{R_{var} I}{V_{GSR1} - V_T}} \tag{14}$$

where $V_{GSAR1}$ is the gate-to-source voltage of MR1.

The incremental gain of the LSBA in FIG. 8 is given by $$a_v = \frac{1 + \frac{R_{var} I}{V_{GSR2} - V_T}}{1 + \frac{1}{g_{m1} r_{o1}}} \tag{15}$$

where $V_{GSR2}$ is the gate-to-source voltage of MR2.

The incremental gain of the circuit in FIG. 8 is higher than that in FIG. 7, and may be preferred for some applications.

Figure 9:
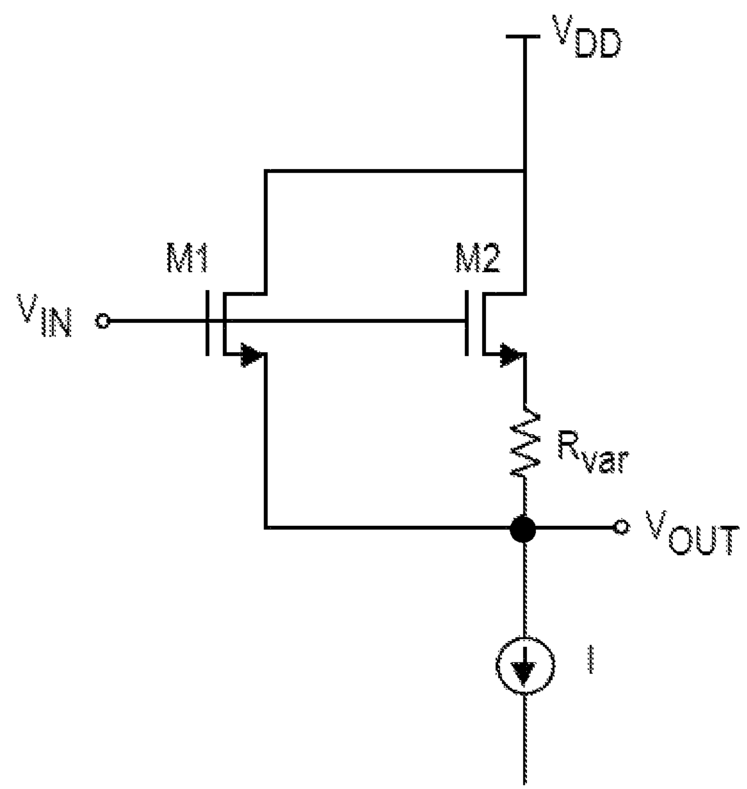
FIG. 9 is a schematic diagram of a level shifting buffer amplifier circuit according to a fifth embodiment of the invention.

FIG. 9 illustrates another embodiment of the present invention. It comprises a parallel connection of a first source follower M1 and a second source follower M2 with a series variable resistor $R_{VAR}$. Preferably, M1 and M2 have two different threshold voltages such that $V_{T1} > V_{T2}$, where $V_{T1}$ is the threshold voltage of M1 and $V_{T2}$ is the threshold voltage of M2. In one example, M1 may be a standard $V_T$ device and M2 may be a low $V_T$ device. In another example, M1 may be a high $V_T$ device and M2 may be a standard $V_T$ device. In yet another example, M1 may be a high $V_T$ device and M2 maybe a low $V_T$ device. As $R_{var}$ is varied, the amount of level shift is varied. When $R_{var}$ is very small, the voltage drop $IR_{var}$ across $R_{var}$ is small. In this case, most of the current $I+I_O$ flows through M2 because $V_{T2}$ is lower, and M1 is nearly OFF. In this case, the level shift is determined by the gate-to-source voltage $V_{GS2}$ of M2:

$$V_{LS} = V_{GS2} + IR_{var} \approx V_{GS2} = V_{T2} + \sqrt{\frac{2(I + I_O)}{\mu_n C_{OX} \left(\frac{W}{L}\right)_2}} \tag{16}$$

where $V_{GS2}$ is the gate-to-source voltage of M2, and $$\left(\frac{W}{L}\right)_2$$

is tne W over L ratio of M2. The output resistance is determined by $g_{m2}$ of M2:

$$R_o \approx \frac{1}{g_{m2}} + R_{var} \approx \frac{1}{g_{m2}} \tag{17}$$

On the other hand, if $R_{var}$ is very large, most of the bias current I is steered to M1, and M2 is nearly OFF. In this case, the level shift is determined by the gate-to-source voltage $V_{GS1}$ of M1:

$$V_{LS} \approx V_{GS1} = V_{T1} + \sqrt{\frac{2(I + I_O)}{\mu_n C_{OX} \left(\frac{W}{L}\right)_1}} \tag{18}$$

where $V_{GS1}$ is the gate-to-source voltage of M1, $$\left(\frac{W}{L}\right)_1$$

is the W over L ratio of M1. The output resistance is determined by $g_{m1}$ of M2:

$$R_o \approx \frac{1}{g_{m1}} \tag{19}$$

By varying $R_{var}$ in between these two extremes, the level shift can be varied continuously between the values given in Equations (14) and (16). Therefore, the range of level shift is given by $$V_{T2} + \sqrt{\frac{2(I + I_O)}{\mu_n C_{OX} \left(\frac{W}{L}\right)_2}} \le V_{LS} \le V_{T1} + \sqrt{\frac{2(I + I_O)}{\mu_n C_{OX} \left(\frac{W}{L}\right)_1}} \tag{20}$$

Figure 10:
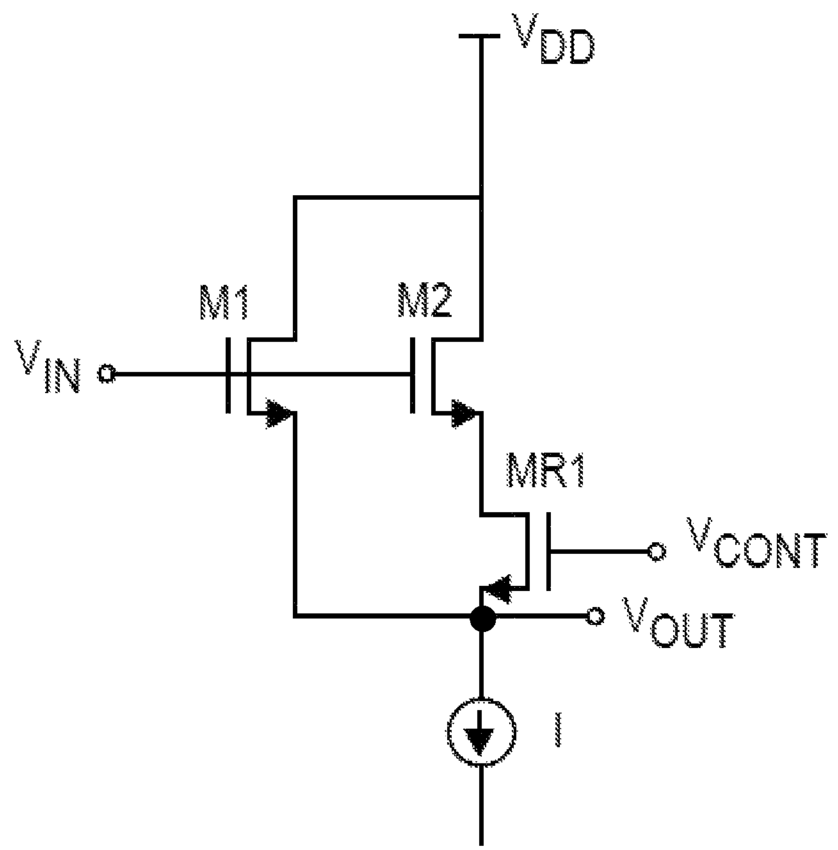
FIG. 10 is a schematic diagram of a level shifting buffer amplifier circuit according to a sixth embodiment of the invention.
Figure 11:
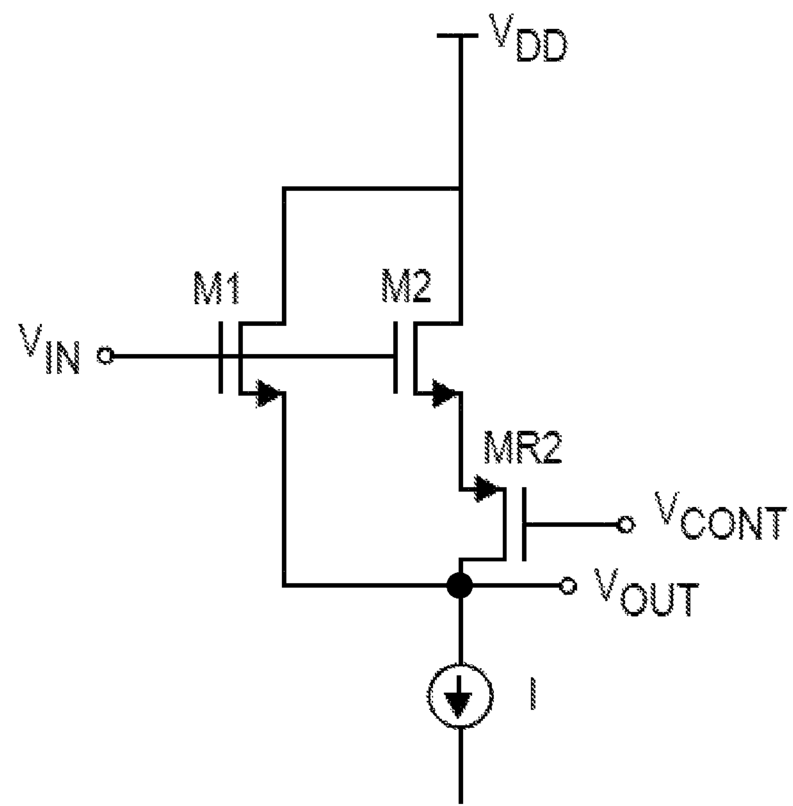
FIG. 11 is a diagram of a control loop to keep the level shift constant in level shifting buffer amplifier circuits according to various embodiments of the invention.

Again, the variable resistor $R_{var}$ can be implemented by an NMOS transistor as shown in FIG. 10 or by a PMOS transistor as shown in and FIG. 11.

The adjustability, which is the difference between the upper and lower bounds of the level shift is given by $$\Delta V_{LS} \approx V_{T1} - V_{T2} + \sqrt{\frac{2(I + I_O)}{\mu_n C_{OX} \left(\frac{W}{L}\right)_1}} - \sqrt{\frac{2(I + I_O)}{\mu_n C_{OX} \left(\frac{W}{L}\right)_2}} \tag{21}$$

If sizes of M1 and M2 are equal, the adjustability reduces to the difference between the threshold voltages:

$$\Delta V_{LS} \approx V_{T1} - V_{T2} \tag{22}$$

However, making $$\left(\frac{W}{L}\right)_2 > \left(\frac{W}{L}\right)_1$$

gives wider adjustability. In addition, if transistors with different threshold voltages are not available, $V_{T1}$ and $V_{T2}$ are equal, unequal sizing between M1 and M2 gives the adjustability of $$\Delta V_{LS} \approx \sqrt{\frac{2(I + I_O)}{\mu_n C_{OX} \left\{\left(\frac{W}{L}\right)_1 + \left(\frac{W}{L}\right)_2\right\}}} - \sqrt{\frac{2(I + I_O)}{\mu_n C_{OX} \left(\frac{W}{L}\right)_2}} \tag{23}$$

Figure 12:
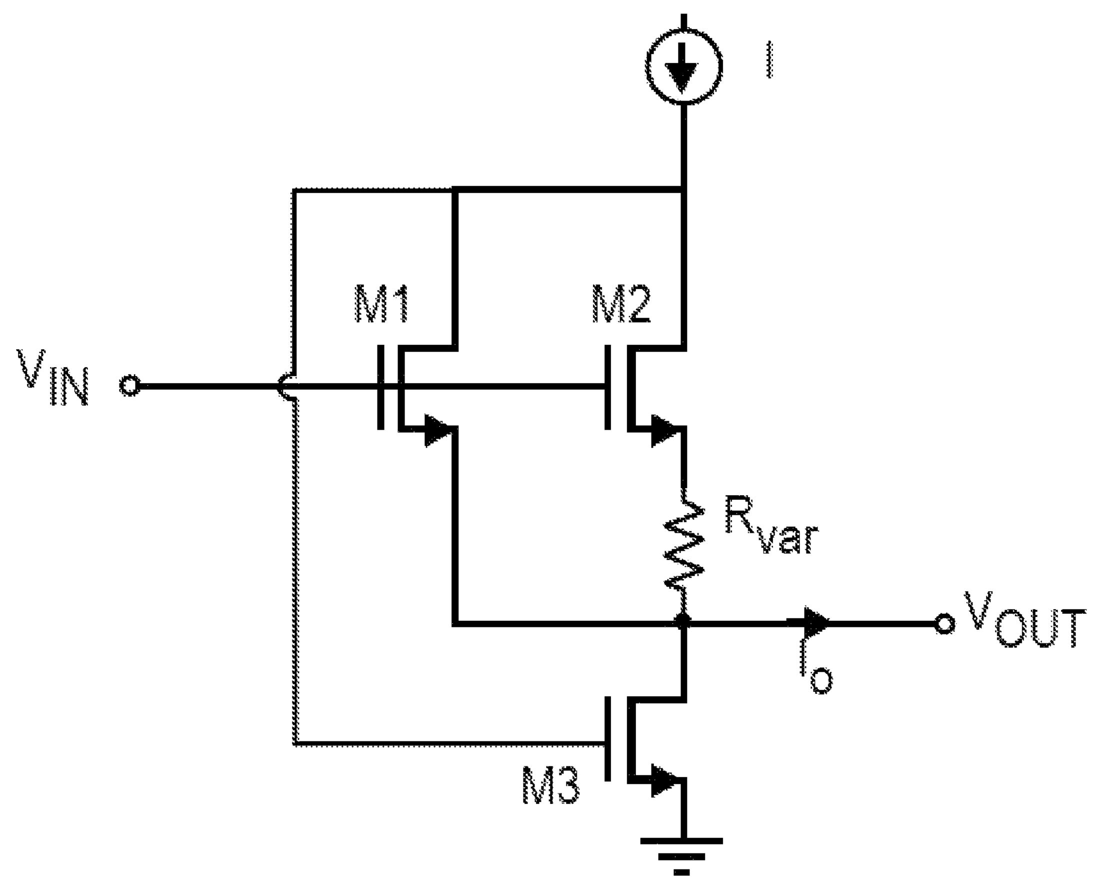
FIG. 12 is an illustration of one embodiment of a combination of a difference amplifier and an integrator in a control loop shown in FIG. 11.

FIG. 12 illustrates another embodiment of the present invention. It comprises a FSF with a parallel connection of a first source follower M1 and a second source follower M2 with a series variable resistor $R_{VAR}$. Preferably, M1 and M2 have two different threshold voltages such that $V_{T1}>V_{T2}$, where $V_{T1}$ is the threshold voltage of M1 and $V_{T2}$ is the threshold voltage of M2. In one example, M1 may be a standard $V_T$ device and M2 may be a low $V_T$ device. In another example, M1 may be a high $V_T$ device and M2 may be a standard $V_T$ device. In yet another example, M1 may be a high $V_T$ device and M2 maybe a low $V_T$ device. As $R_{var}$ is varied, the amount of level shift is varied. When $R_{var}$ is very small, the voltage drop $IR_{var}$ across $R_{var}$ is small. In this case, most of the current I flows through M2, and M1 is nearly OFF. In this case, the level shift is determined by the gate-to-source voltage $V_{GS2}$ of M2:

$$V_{LS} = V_{GS2} + IR_{var} \approx V_{GS2} = V_{T2} + \sqrt{\frac{2I}{\mu_n C_{OX}\left(\frac{W}{L}\right)_2}} \tag{24}$$

where $V_{GS2}$ is the gate-to-source voltage of M2, $$\left(\frac{W}{L}\right)_2$$

is the W over L ratio of M2. The output resistance is significantly reduced by the factor of $g_{m2}r_{o1}$ by the negative feedback provided by M3 as in the FSF, and is given by:

$$R_o \approx \frac{\frac{1}{g_{m2}} + R_{var}}{g_{m3}r_{o1}} \approx \frac{1}{g_{m3}r_{o1}g_{m2}} \tag{25}$$

On the other hand, if $R_{var}$ is very large, most of the bias current I is steered to M1, and M2 is nearly OFF. In this case, the level shift is determined by the gate-to-source voltage $V_{GS1}$ of M1:

$$V_{LS} \approx V_{GS1} = V_{T1} + \sqrt{\frac{2I}{\mu_n C_{OX}\left(\frac{W}{L}\right)_1}} \tag{26}$$

where $V_{GS1}$ is the gate-to-source voltage of M1, $$\left(\frac{W}{L}\right)_1$$

is the W over L ratio of M1. The output resistance is given by:

$$R_o \approx \frac{1}{g_{m3}r_{o1}g_{m1}} \tag{27}$$

By varying $R_{var}$ in between these two extremes, the level shift can be varied continuously between the values given in Equations (14) and (16). Therefore, the range of level shift is given by $$V_{T2} + \sqrt{\frac{2I}{\mu_n C_{OX}\left(\frac{W}{L}\right)_2}} \le V_{LS} \le V_{T1} + \sqrt{\frac{2I}{\mu_n C_{OX}\left(\frac{W}{L}\right)_1}} \tag{28}$$

Figure 13:
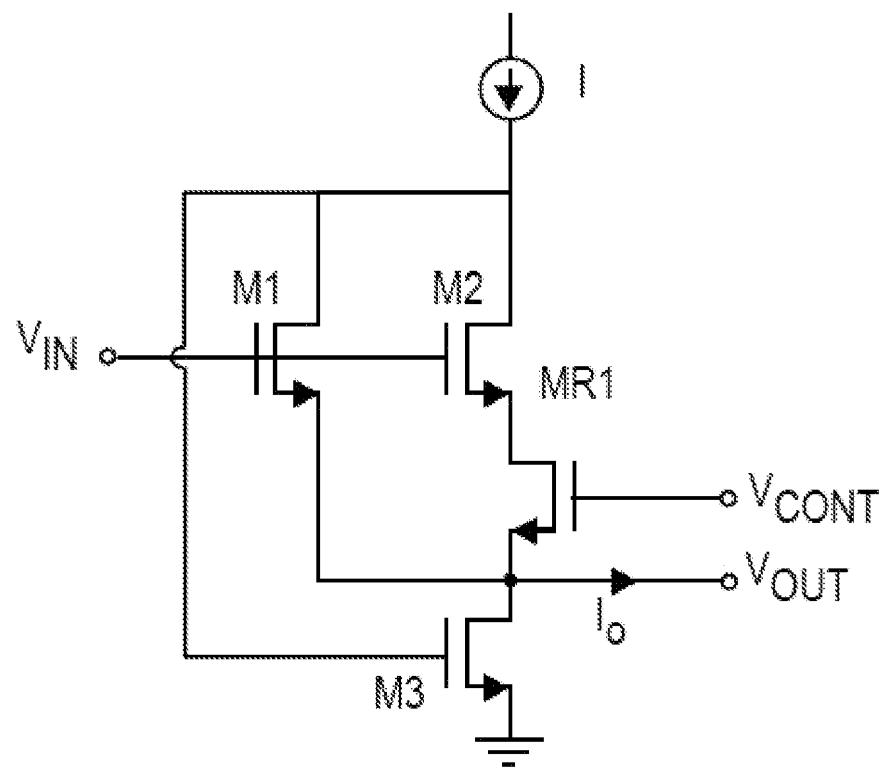
FIG. 13 illustrates an embodiment of an amplifier with a variable resistance implemented in a NMOS transistor.
Figure 14:
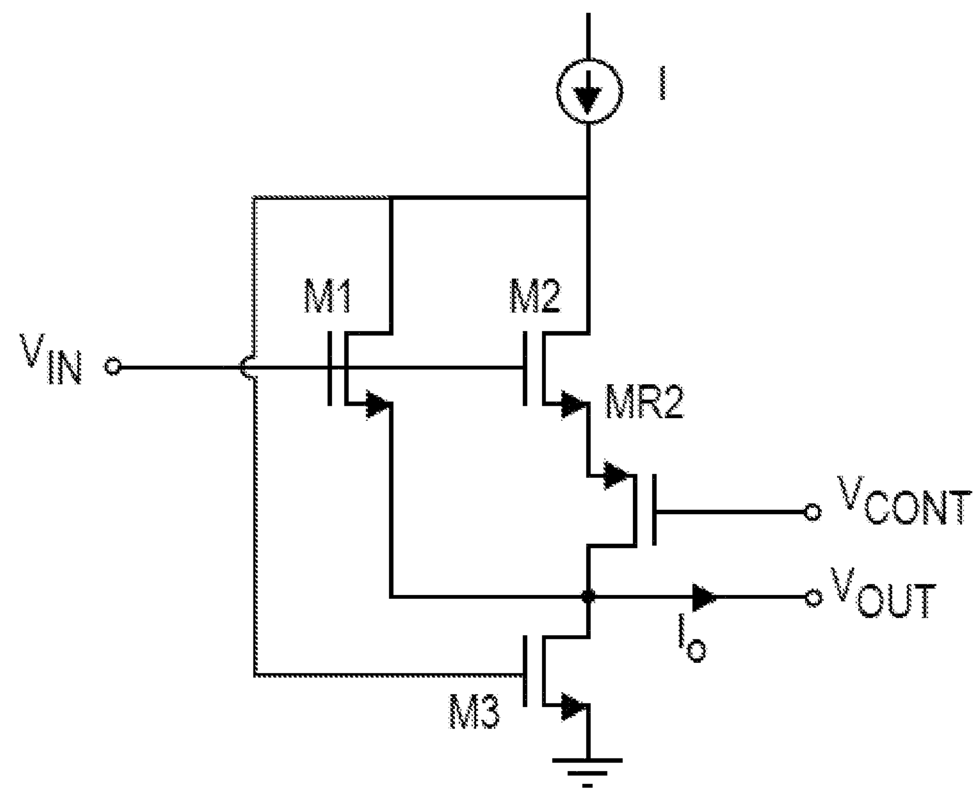
FIG. 14 illustrates an embodiment of an amplifier with a variable resistance implemented in a PMOS transistor.

Again, the variable resistor $R_{var}$ can be implemented by an NMOS transistor or a PMOS transistor, as shown in FIG. 13 and FIG. 14, respectively.

The adjustability, which is the difference between the upper and lower bounds of the level shift is given by $$\Delta V_{LS} \approx V_{T1} - V_{T2} + \sqrt{\frac{2I}{\mu_n C_{OX}\left(\frac{W}{L}\right)_1}} - \sqrt{\frac{2I}{\mu_n C_{OX}\left(\frac{W}{L}\right)_2}} \tag{29}$$

If sizes of M1 and M2 are equal, the adjustability reduces to the difference between the threshold voltages:

$$\Delta V_{LS} = V_{T1} - V_{T2} \tag{30}$$

However, making $$\left(\frac{W}{L}\right)_2 > \left(\frac{W}{L}\right)_1$$

gives wider adjustability. In addition, if transistors with different threshold voltages are not available, $V_{T1}$ and $V_{T2}$ are equal, unequal sizing between M1 and M2 gives the adjustability of $$\Delta V_{LS} \approx \sqrt{\frac{2I}{\mu_n C_{OX}\left\{\left(\frac{W}{L}\right)_1 + \left(\frac{W}{L}\right)_2\right\}}} - \sqrt{\frac{2I}{\mu_n C_{OX}\left(\frac{W}{L}\right)_2}} \tag{31}$$

Figure 15:
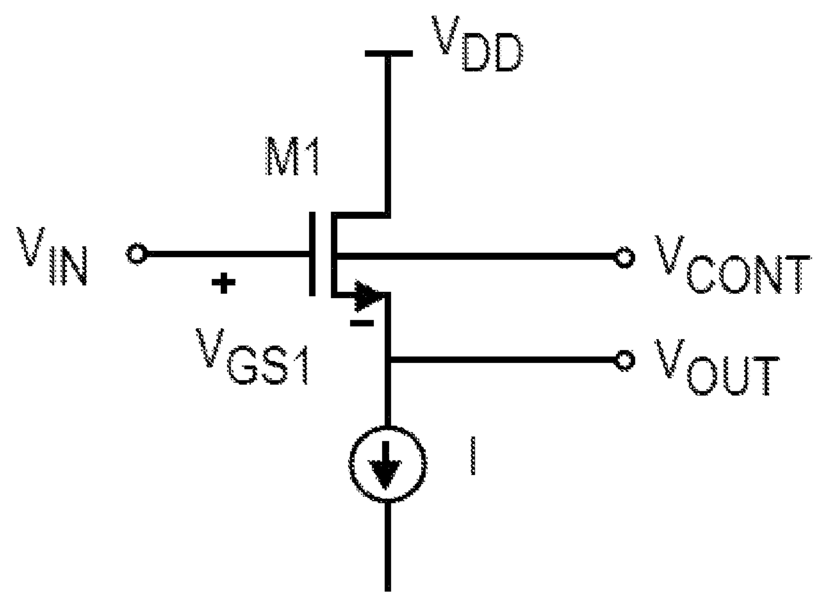
FIG. 15 illustrates an embodiment comprising a source follower with a variable threshold transistor.

FIG. 15 illustrates another embodiment of the present invention. It comprises a source follower with a variable threshold transistor M1. The threshold voltage of M1 is controlled by changing the control voltage $V_{cont}$. In one example, the variable threshold transistor M1 is implemented in fully-depleted silicon-on-insulator (FDSOI) technology. The control voltage $V_{cont}$ is applied to the back-gate voltage of the transistor. The FDSOI technology is superior to bulk CMOS technology for this embodiment because the threshold voltage can be varied by a large amount, by as much as a few hundred millivolts.

Figure 16:
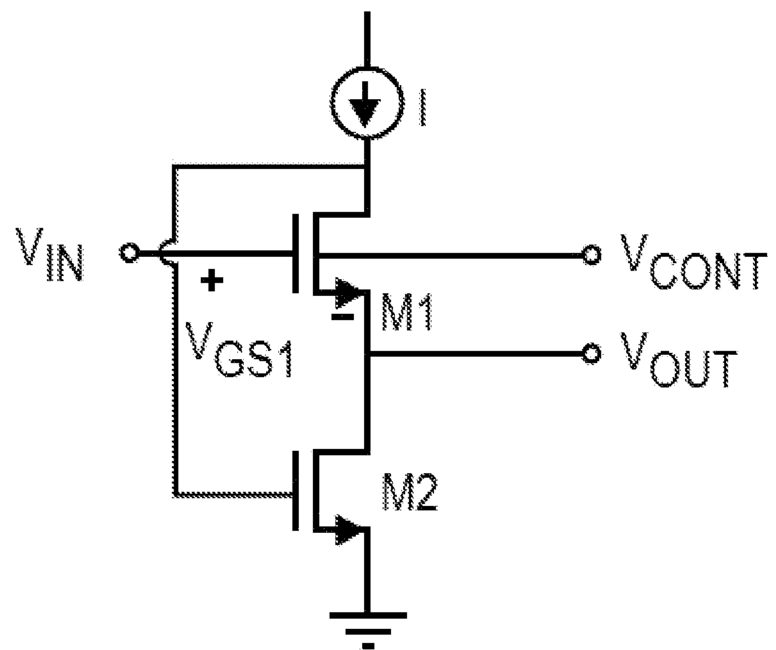
FIG. 16 illustrates an embodiment comprising a FSF with a variable threshold transistor.

FIG. 16 illustrates another embodiment of the present invention. It comprises a FSF with a variable threshold transistor M1. The threshold voltage of M1 is controlled by changing the control voltage $V_{cont}$. In one example, the variable threshold transistor M1 is implemented in fully-depleted silicon-on-insulator (FDSOI) technology. The control voltage $V_{cont}$ is applied to the back-gate voltage of the transistor.

Figure 17:
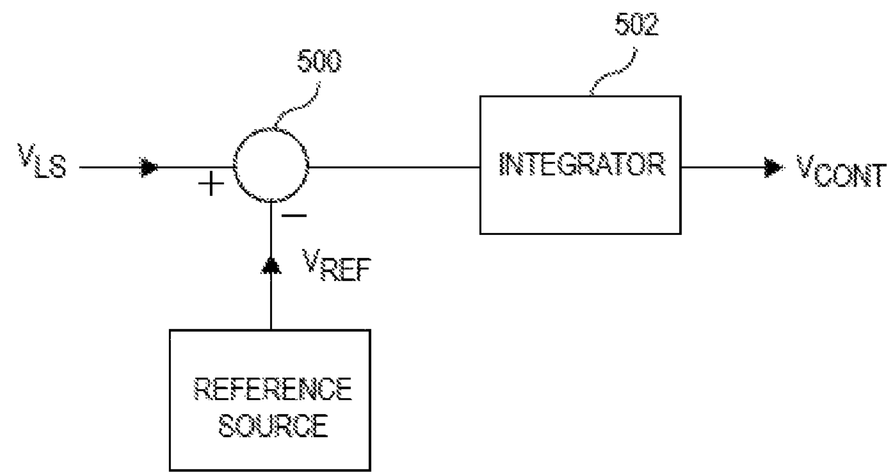
FIG. 17 illustrates an embodiment comprising a feedback control loop.
Figure 18:
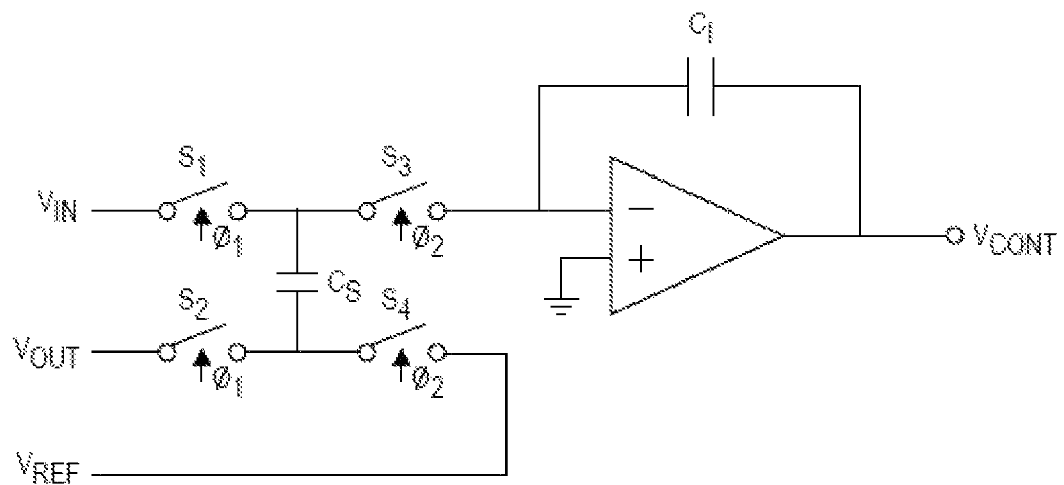
FIG. 18 illustrates a switching circuit portion comprising a differential switched-capacitor integrator.

FIG. 17 illustrates a feedback control loop to keep the level shift constant across PVT variations. A difference circuit 500 produces a difference between the level shift $V_{LS}$ and a reference voltage $V_{REF}$. Th reference voltage $V_{REF}$ is preferably independent of PVT variations. The reference voltage $V_{REF}$ can be produced, for example, by a bandgap reference source. The difference $V_{LS}-V_{REF}$ is integrated by an integrator 502. The output of the integrator drives the control voltage $V_{cont}$, in the various embodiments of the present invention. In one example, the difference circuit 500 and the integrator 502 are implemented by a differential switched-capacitor integrator shown in FIG. 18. Its operation is controlled by two non-overlapping clock phases, $\varphi_1$ and $\varphi_2$. When $\varphi_1$ is 'high' switches S1 and S2 are 'ON', and S3 and S4 are 'OFF'. The input voltage and the output voltage of the buffer, the difference of which is equal to $V_{LS}$, are sampled across the sampling capacitor $C_S$ during this phase. When $\varphi_2$ is 'high' switches S3 and S4 are 'ON', and S1 and S2 are 'OFF', applying the reference voltage $V_{REF}$ on the lower plate of $C_S$. It can be shown that the resulting change of the integrator output voltage $\Delta V_o$ is given by $$\Delta V_o = V_{IN} - V_{OUT} = V_{LS} - V_{REF} \tag{32}$$

If $V_{LS}$ is larger than $V_{REF}$, the integrator output voltage keeps increasing after each clock cycle by $\Delta V_o$, because $\Delta V_o$ is positive. This increases the control voltage $V_{cont}$. In the embodiments where the variable resistor is implemented by an NMOS transistor, this reduces $R_{var}$, and thus $V_{LS}$. Therefore, this negative feedback reduces $V_{LS}$ such that $V_{LS}=V_{REF}$. In other embodiments, the control voltage needs to be reduced if $V_{LS}$ is larger than $V_{REF}$. In these embodiments, a polarity inversion of the integrator output voltage is necessary. This can be accomplished for example, by using an inverting amplifier coupled to the output of the integrator, or by using a fully-differential integrator.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. As a specific example, it may be desired to use PMOS input transistors in the amplifier circuits in FIGS. 3-16 instead of the NMOS input transistors as shown in the exemplary figures. Such "flipped" configurations will be appreciated by those who are skilled in the art. It is, therefore, to be understood that the foregoing embodiments are presented by way of example only and that, within the scope of the appended claims and equivalents thereto, inventive embodiments may be practiced otherwise than as specifically described. Inventive embodiments of the present disclosure are directed to each individual feature, system, article, material, kit, and/or method described herein. In addition, any sensible combination of two or more such features, systems, articles, materials, kits, and/or methods, if such features, systems, articles, materials, kits, and/or methods are not mutually inconsistent, is included within the inventive scope of the present disclosure.

Also, the invention described herein may be embodied as a method. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The invention should not be considered limited to the particular embodiments described above, but rather should be understood to cover all aspects of the invention as fairly set out in the attached claims. Various modifications, equivalent processes, as well as numerous structures to which the invention may be applicable, will be apparent to those skilled in the art to which the invention is directed upon review of this disclosure. The claims are intended to cover such modifications and equivalents.

What is claimed is:

1. A level-shifting buffer amplifier producing a level shift between input and output terminals, comprising:
- a current source;
- a first transistor electrically coupled to the input terminal and the output terminal;
- a second transistor electrically coupled to the input terminal and the current source; and
- a variable resistance electrically coupled to the first transistor and the output terminal, wherein a resistance of the variable resistance is a first function of a voltage at a control terminal,
- wherein the level shift is a second function of the voltage at the control terminal.

2. The buffer amplifier of claim 1, wherein a threshold voltage of the first transistor is lower than a threshold voltage of the second transistor.

3. The buffer amplifier of claim 2, further comprising a third transistor electrically coupled to the first and the second transistors, providing a negative feedback.

4. The buffer amplifier of claim 3, wherein the first transistor is an NMOS transistor.

5. The buffer amplifier of claim 3, wherein the first transistor is a PMOS transistor.

6. A level-shifting buffer amplifier, comprising:
- an input terminal and an output terminal a first transistor having a back-gate terminal; and
- a current source;
- a second transistor electrically coupled to the first transistor and the current source, providing a negative feedback,
- wherein:
  - the first transistor is a fully-depleted silicon-on-insulator transistor, and
  - a control voltage is applied to the back-gate terminal to provide a constant level shift between the input and the output terminals.

7. The buffer amplifier of claim 6, wherein the first transistor is an NMOS transistor.

8. The buffer amplifier of claim 6, wherein the first transistor is a PMOS transistor.

* * * * *